(12) United States Patent
Nakata

(10) Patent No.: US 10,943,999 B2
(45) Date of Patent: Mar. 9, 2021

(54) FIELD EFFECT TRANSISTOR AND PROCESS OF FORMING THE SAME

(71) Applicant: SUMITOMO ELECTRIC INDUSTRIES, LTD., Osaka (JP)

(72) Inventor: Ken Nakata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/751,787

(22) Filed: Jan. 24, 2020

(65) Prior Publication Data

US 2020/0161465 A1     May 21, 2020

Related U.S. Application Data

(62) Division of application No. 16/143,145, filed on Sep. 26, 2018, now Pat. No. 10,580,887.

(30) Foreign Application Priority Data

Sep. 27, 2017 (JP) .............................. JP2017-186637

(51) Int. Cl.
*H01L 21/316* (2006.01)
*H01L 29/778* (2006.01)
(Continued)

(52) U.S. Cl.
CPC ...... *H01L 29/7787* (2013.01); *H01L 21/0254* (2013.01); *H01L 21/02057* (2013.01); *H01L 21/0262* (2013.01); *H01L 21/0273* (2013.01); *H01L 21/02178* (2013.01); *H01L 21/02189* (2013.01); *H01L 21/02554* (2013.01); *H01L 21/02565* (2013.01); *H01L 21/02576* (2013.01); *H01L 21/02631* (2013.01); *H01L 21/02636* (2013.01); *H01L 21/30621* (2013.01); *H01L 21/443* (2013.01); *H01L 21/465* (2013.01); *H01L 29/0891* (2013.01); *H01L 29/1029* (2013.01); *H01L 29/267* (2013.01); *H01L 29/66462* (2013.01); *H01L 29/66969* (2013.01); *H01L 29/7786* (2013.01);
(Continued)

(58) Field of Classification Search
CPC ............. H01L 21/823418; H01L 29/45; H01L 29/66636; H01L 29/66462
See application file for complete search history.

(56) References Cited

U.S. PATENT DOCUMENTS 9,401,397 B1 * 7/2016 de Souza ............ H01L 29/0634
10,290,719 B1    5/2019 Li
(Continued)

FOREIGN PATENT DOCUMENTS

JP      2008-227432      9/2008

*Primary Examiner* — George R Fourson, III
(74) *Attorney, Agent, or Firm* — Smith, Gambrell & Russell, LLP.

(57) ABSTRACT

A process of forming a field transistor (FET) and a FET are disclosed. The FET includes a nitride semiconductor stack on a substrate. A pair of $n^+$-regions made of oxide semiconductor material are provided within respective recesses in the semiconductor stack. Protecting layers, each made of oxide material, cover peripheries of the $n^+$-regions. Electrodes are provided in openings in the protecting layers to be in direct contact with the $n^+$-regions.

7 Claims, 8 Drawing Sheets

(51) Int. Cl.
    *H01L 21/306* (2006.01)
    *H01L 21/02* (2006.01)
    *H01L 21/465* (2006.01)
    *H01L 21/443* (2006.01)
    *H01L 21/027* (2006.01)
    *H01L 29/267* (2006.01)
    *H01L 29/66* (2006.01)
    *H01L 29/08* (2006.01)
    *H01L 29/10* (2006.01)
    *H01L 29/20* (2006.01)
    *H01L 29/786* (2006.01)
    *H01L 21/8234* (2006.01)
    *H01L 29/45* (2006.01)

(52) U.S. Cl.
    CPC .. *H01L 21/02458* (2013.01); *H01L 21/02502* (2013.01); *H01L 21/823418* (2013.01); *H01L 29/0843* (2013.01); *H01L 29/2003* (2013.01); *H01L 29/45* (2013.01); *H01L 29/66636* (2013.01); *H01L 29/78681* (2013.01)

(56) References Cited

U.S. PATENT DOCUMENTS

| | | |
|---|---|---|
| 2016/0240620 A1 | 8/2016 | De Souza et al. |
| 2016/0260816 A1 | 9/2016 | Kapoor |
| 2016/0268377 A1 | 9/2016 | De Souza et al. |
| 2017/0033177 A1 | 2/2017 | De Souza et al. |
| 2017/0040463 A1 | 2/2017 | Kim |
| 2017/0092747 A1 | 3/2017 | Nakata |
| 2017/0200790 A1 | 7/2017 | Hitora |
| 2017/0263743 A1 | 9/2017 | Nakata |
| 2019/0043978 A1 | 2/2019 | Makabe |
| 2019/0165130 A1 | 5/2019 | Yoshida |
| 2019/0305135 A1 | 10/2019 | Radosavljevic |

* cited by examiner

FIELD EFFECT TRANSISTOR AND PROCESS OF FORMING THE SAME

CROSS REFERENCE TO RELATED APPLICATION

The present application is based on and claims the benefit of priority of Japanese Patent Application No. 2017-186637, filed on Sep. 27, 2017, the entire content of which is incorporated herein by reference. The present application also is a division of U.S. application Ser. No. 16/143,145 filed on Sep. 26, 2018 and likewise incorporates the entire disclosure of said U.S. application herein.

BACKGROUND OF INVENTION

1. Field of Invention

The present invention relates to a field effect transistor (FET), in particular, an FET of a type of high electron mobility transistor (HEMT) and a process of forming the HEMT.

2. Background Arts

A Japanese Patent Application laid open No. JP2008-227432A has disclosed an electron device primarily made of nitride semiconductor materials and a process of forming the electron device. The process disclosed therein forms a recess by partially etching a p-type gallium nitride (GaN) layer and performing re-growth of a highly doped n-type contact layer within the recess. Thereafter, a source electrode and a drain electrode are formed on the contact layer, where those electrodes make an ohmic contact to the contact layer.

Faster operational speed has been continuously requested to an FET in the field, which is equivalent to enhance a cut-off frequency ft. Reduction of parasitic capacitance around a gate electrode and an increase of trans-conductance gm are well known technique to enhance the cut-off frequency ft. Moreover, reduction of resistance between the gate electrode and the source electrode may also enhance the trans-conductance gm, which may be realized by not only reducing access resistance from a source region to a channel of the FET but decreasing contact resistance between a source electrode and the source region.

One technique has been known in the field to reduce the contact resistance, where the technique first forms a recess in the source region, then selectively grows a highly doped semiconductor region within the recess. The prior patent document above mentioned has disclosed such a process. The highly doped n-type region, which is often denoted as an $n^+$-region, may reduce not only the contact resistance against the source electrode but the access resistance to the channel of the FET. However, a selective growth of a nitride semiconductor material has been limited in impurity density of an n-type dopant; because a mono-silane ($SiH_4$), which is a typical and probably only one impurity source for silicon (Si) that is an n-type dopant in nitride semiconductor materials, inherently shows a saturated dissociation, which restricts the number of Si atoms to be doped within the semiconductor material.

Other compound semiconductor materials except for nitride semiconductor materials may be substituted in the $n^+$-region in order to increase a carrier concentration. For instance, zinc oxide (ZnO) may be applicable to a material for the selectively formed in $n^+$-region. However, because such an oxide semiconductor material generally shows lesser tolerance against acid and/or alkali, a process of forming an FET sometimes causes defects in the $n^+$-region or breaks the $n^+$-region made of such oxide semiconductor materials.

SUMMARY OF INVENTION

One aspect of the present invention relates to a field effect transistor (FET), in particular, a FET type of high electron mobility transistor (HEMT) primarily made of nitride semiconductor materials. The FET comprises a substrate; a semiconductor stack; a pair of recesses provided in a surface of the semiconductor stack; a pair of $n^+$-regions provided within the respective recesses; pair of protecting layers each made of oxide material; and a pair of electrodes provided within the opening in the protecting layers. The semiconductor stack includes nitride semiconductor layers. The $n^+$-regions are made of oxide semiconductor materials doped with n-type dopants by density higher than $1 \times 10^{19}$ $cm^{-3}$. The protecting layers have respective openings and covering peripheries of the $n^+$-regions. The electrodes are in direct contact with the $n^+$-regions.

Another aspect of the present invention relates to a process of forming a field effect transistor (FET). The process includes steps of: (a) forming a nitride semiconductor layer on a substrate; (b) selectively growing an $n^+$-region, which is made of oxide semiconductor material, on the nitride semiconductor layer and depositing oxide film on the $n^+$-region; (c) rinsing a surface of the oxide film with an acidic solution; (d) forming an opening in the oxide film, where the opening exposes the $n^+$-region therein; and (e) depositing a metal within the opening, where the metal is in direct contact with the $n^+$-region.

BRIEF DESCRIPTION OF DRAWINGS

The foregoing and other purposes, aspects and advantages will be better understood from the following detailed description of a preferred embodiment of the invention with reference to the drawings, in which:

FIG. 8 is a histogram showing distribution of resistance between the drain electrode and the source electrode when the HEMT is turned on.

DESCRIPTION OF EMBODIMENT

Next, embodiment according to the present invention will be described. The present invention, however, is not restricted to the embodiment, but has a scope defined in claims and all changes and modifications equivalent thereto. In the description of the drawings, numerals or symbols same with or similar to each other will refer to elements same with or similar to each other without duplicating explanations.

Figure 1:
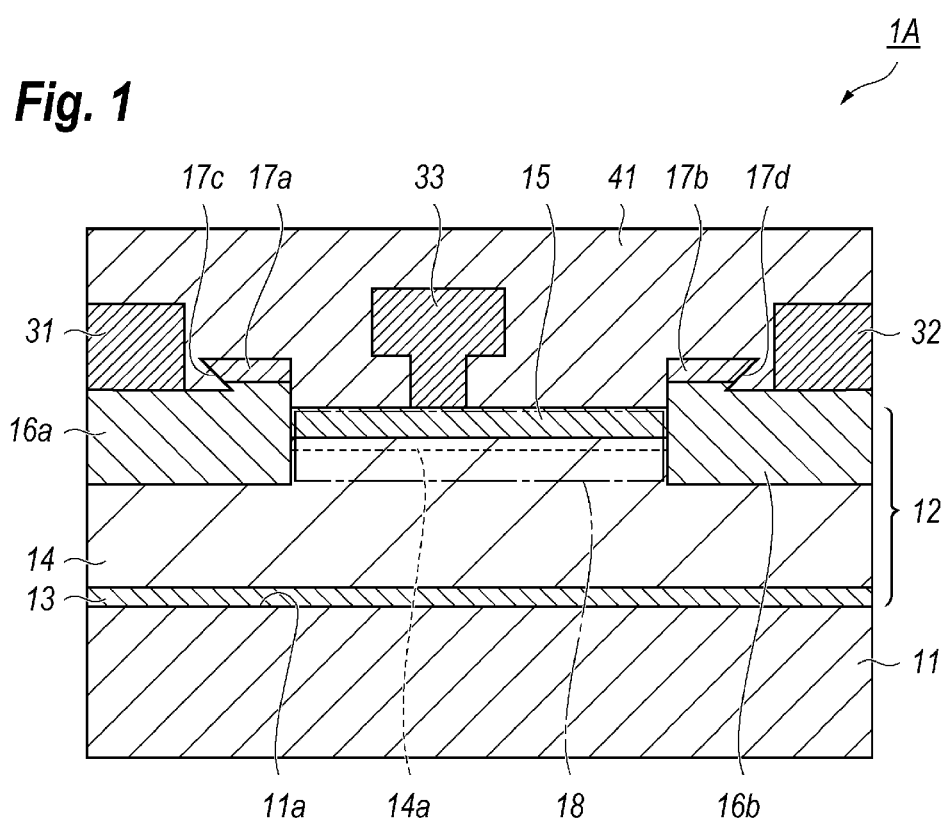
FIG. 1 is a cross sectional view of a field effect transistor type of high electron beam transistor (HEMT) according to embodiment of the present invention.

FIG. 1 is a cross sectional view of a field effect transistor 1A type of high electron mobility transistor (HEMT) according to embodiment of the present invention. The HEMT 1A provides a substrate 11, a semiconductor stack 12 including nitride semiconductor layers, and electrodes of a source 31, a drain 32, and a gate 33. The semiconductor stack 12 includes a buffer layer 13, a channel layer 14, and a barrier layer 15 from a side of the substrate 11 in this order. The HEMT 1A further provides a pair of n$^+$-regions, 16a and 16b, and a pair of protecting layers, 17a and 17b. The HEMT 1A is covered with an insulating film 41, where the electrodes of the source 31, the drain 32, and the gate 33 are connected with respective interconnections through openings formed in the insulating film 41.

The substrate 11, which is a substrate for epitaxially growing semiconductor layers thereon, may be made of silicon carbide (SiC), sapphire ($Al_2O_3$), Silicon (Si), and the like. The buffer layer 13, which is epitaxial grown on the substrate 11, may be made of nitride semiconductor material containing aluminum (Al) such as aluminum nitride (AlN), aluminum gallium nitride (AlGaN), and so on. The buffer layer 13 may have a thickness of 10 to 100 nm. The channel layer 14, which is epitaxially grown on the buffer layer 13, may be made of nitride semiconductor material, typically gallium nitride (GaN) and preferably have a thickness of 400 to 1200 nm.

The barrier layer 15, which is epitaxially grown on the channel layer 14, may be also made of semiconductor material but having bandgap energy greater than that of the channel layer 14. The barrier layer 15 may be made of AlGaN and/or indium aluminum nitride (InAlN), and preferably has a thickness of 5 to 20 nm. The present HEMT 1A has the barrier layer 15 with a thickness of 8 nm. The barrier layer 15 and the channel layer 14 causes a stress due to a difference in lattice constants of the two materials, which induces a two-dimensional electron gas (2DEG) in the channel layer 14 at an interface against the barrier layer 15 because of the Piezo effect. A bandgap difference between two materials also causes carriers in the 2DEG. The 2DEG becomes a channel 14a for transporting carriers. In a case when the barrier layer 15 is made of InAlN, the barrier layer 15 preferably has an aluminum (Al) composition of 15 to 19%, taking the lattice matching against the channel layer 14 into account. The Al composition of 17% is preferable. When the barrier layer 15 has the lattice constant substantially matched with that of the channel layer 14, the carriers induced by the bandgap difference dominates in the 2DEG.

The n$^+$-regions, 16a and 16b, are provided so as to put the barrier layer 15 and the channel 14 without any gaps therebetween, where the portion of the channel layer 14 including the channel 14a and the barrier layer 15 comprise a primary portion 18 on the surface 11a of the substrate 11. The n$^+$-regions, 16a and 16b, are provided within respective recesses formed by etching portions of the barrier layer 15 and portions of the channel layer 14. The n$^+$-regions, 16a and 16b may be made of n-type zinc oxide (ZnO), or n-type magnesium zinc oxide (MgZnO), doped with at least one of aluminum (Al) and gallium (Ga) by density greater than $1 \times 10^{19}$ cm$^3$, preferably greater than $1 \times 10^{20}$ cm$^3$. The n$^+$-regions, 16a and 16b, preferably have a thickness greater than that of the barrier layer 15 but smaller than a total thickness of the barrier layer 15 and the channel layer 14, that is, the n$^+$-regions, 16a and 16b, of the present embodiment preferably have a thickness 120 to 200 nm, which means that the n$^+$-regions, 16a and 16b, in respective sides thereof are in contact with the channel 14a. That is, the n$^+$-regions, 16a and 16b, continue to the channel 14a without causing any gaps. The n$^+$-regions, 16a and 16b, of the present embodiment have a thickness of 120 nm.

The protecting layer 17a is provided on the n$^+$-region 16a and in contact thereto. The other protecting layer 17b is provided on the other n$^+$-region 16b and in contact thereto. Those protecting layers, 17a and 17b, may be made of insulating metal oxide, such as aluminum oxide (AlO), zirconium oxide (ZrO), and so on; specifically, the present embodiment provides the protecting layers, 17a and 17b, made of $Al_2O_3$ or $ZrO_2$. The protecting layers, 17a and 17b, provide openings, 17c and 17d, that expose the n$^+$-regions, 16a and 16b, respectively.

Specifically, the protecting layer 17a, which is provided between the source electrode 31 and the primary portion 18, has a side laterally aligned with an end of the n$^+$-region 16a. Similarly, the other protecting layer 17b is provided between the drain electrode 32 and the primary portion 18 and has an end laterally aligned with an end of the other n$^+$-region 16b. The protecting layers, 17a and 17b, each preferably have a thickness of 100 to 500 nm, where the present embodiment has the protecting layers, 17a and 17b, with a thickness of 100 nm.

The electrodes of the source 31, the drain 32, and the gate 33 are laterally disposed on the substrate 11 in this order. Specifically, the source electrode 31, which is disposed on the n$^+$-region 16a exposed in the opening 17c of the protecting layer 17a, makes a non-rectified contact against the n$^+$-region 16a. The drain electrode 32, which is disposed on the other n$^+$-region 16b exposed within the opening 17d of the protecting layer 17b, also makes a non-rectified contact against the other n$^+$-region 16b. In an alternative, the source electrode 31 and the drain electrode 32 may be provided in respective recesses formed in top surfaces of the n$^+$-regions, 16a and 16b. The source electrode 31 and the drain electrode 32 may be formed by alloying stacked metals including indium (In) and gold (Au). The gate electrode 33 is disposed on the primary portion 18 of the semiconductor stack 12 and in contact thereto. The gate electrode 33 includes stacked metals including nickel (Ni) and gold (Au), where Ni is in contact with the primary portion 18 and makes a Schottky contact thereto.

The insulating film 41 covers the semiconductor stack 12, the protecting layers 17a and 17b, the electrodes of the source 31, the drain 32, and the gate 33, where the insulating film 41 may show a function of a passivation layer. The insulating film 41 may be made of inorganic material containing silicon, typically, silicon nitride (SiN), silicon oxide ($SiO2$), silicon oxy-nitride (SiON), and the like.

Figure 2A:
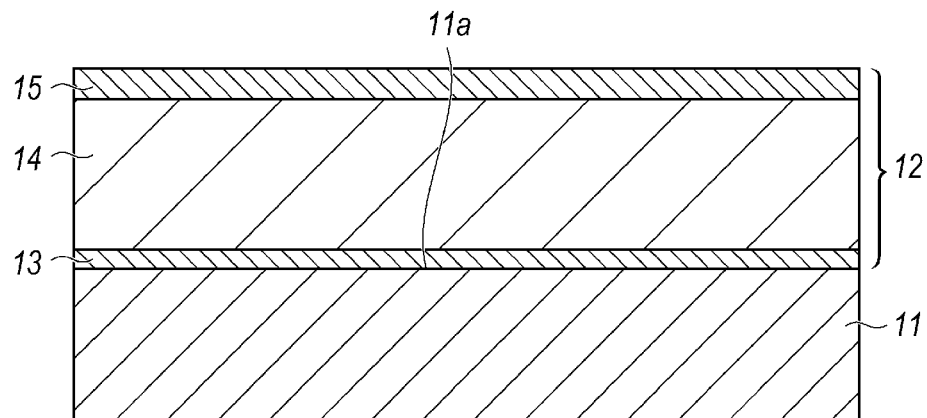
FIG. 2A and FIG. 2B are cross sectional views at respective steps of a process of forming the HEMT shown in FIG. 1.

Next, a process of forming the HEMT 1A will be described as referring to FIG. 2 to FIG. 6. First, the process forms the semiconductor stack 12 on a primary surface 11a of the substrate 11 by sequentially and epitaxially growing the buffer layer 13, the channel layer 14, and the barrier layer 15, as shown in FIG. 2A. Loading the substrate 11 within an apparatus of metal organic chemical vapor deposition (MOCVD) and supplying tri-methyl-aluminum (TMA) and ammonia ($NH_3$) as source materials for aluminum (Al) and nitrogen (N), the buffer layer 13 made of AlN may be grown on the substrate 11 at a temperature of 1000 to 1200° C., where the present embodiment sets the growth temperature to be 1080° C. Then, switching source materials to trimethyl-gallium (TMG) maintaining the supplement of ammonia (NH$_3$), the GaN channel layer 13 is grown on the AlN buffer layer 13 at a temperature of 1100 to 1100° C., where the present embodiments sets the growth temperature of the GaN channel layer 13 equal to that for the AlN buffer layer 13, that is, the growth temperature of the GaN channel layer 14 is set to be 1080° C. The growth pressure is set to be 13.3 kPa. Thereafter, the barrier layer 15 is epitaxially grown on the GaN channel layer 14 by supplying tri-methyl-indium (TMI), TMA, and NH$_3$ as source materials for indium (In), aluminum (Al) and nitrogen (N) when the barrier layer 15 of the present embodiment is made of InAlN. The growth temperature for the InAlN barrier layer 15 is set to be 650 to 850° C., where the present embodiment sets the growth temperature to be 800° C., and the growth pressure to be 15.0 kPa. When the barrier layer 15 is made of AlGaN; TMA, TMG and NH$_3$ are supplied. The growth temperature for the AlGaN barrier layer 15 is preferably set to be 1000 to 1200° C., typically, 1080° C. and the growth pressure to be 13.3 kPa.

Figure 2B:
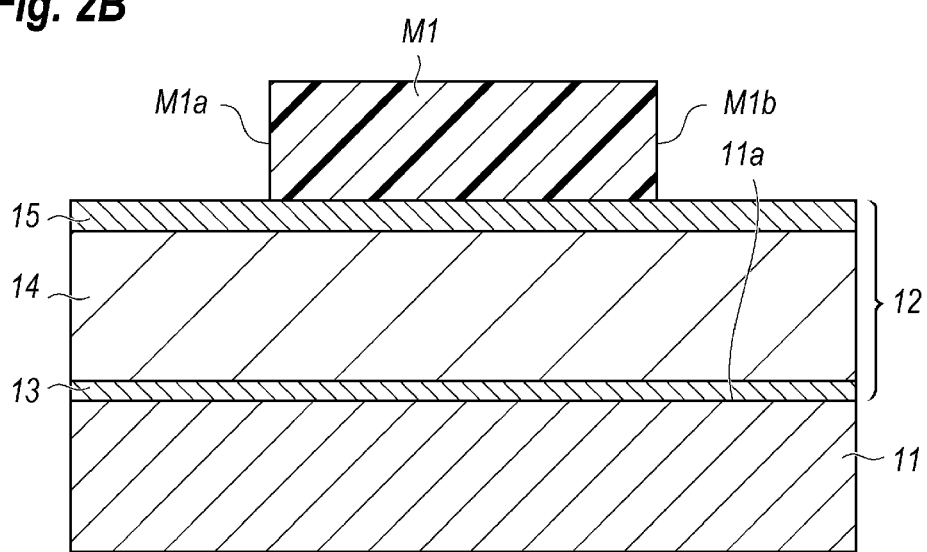

Thereafter, as shown in FIG. 2B, a photolithography prepares a patterned photoresist M$_1$ on the semiconductor stack 12. The patterned photoresist M$_1$ provides openings, M1$a$ and M1$b$, in positions corresponding to the n$^+$-regions, 16$a$ and 16$b$. A conventional photolithography process may form the patterned photoresist M1.

Thereafter, the process forms recesses, 12$a$ and 12$b$, by partially etching the semiconductor stack 12 using the patterned photoresist M1 as an etching mask. A reactive ion etching (RIE) using a gas containing chlorine (Cl) may be used for partially etching the semiconductor stack 12. The recesses, 12$a$ and 12$b$, reach the GaN channel layer 14 removing the barrier layer 15, that is, the recesses, 12$a$ and 12$b$, have a depth at least 80 nm measured from a top surface of the barrier layer 15. Then, the recesses, 12$a$ and 12$b$, are cleaned using hydrofluoric acid (HF) and/or hydrochloric acid (HCl).

Figure 3A:
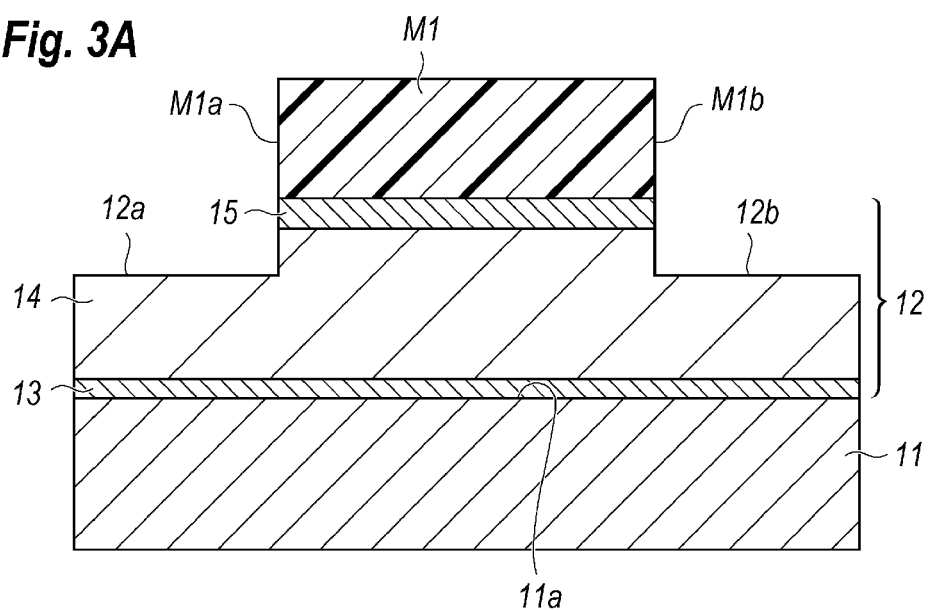
FIG. 3A and FIG. 3B are cross sectional views of the HEMT at respective steps of the process subsequent to the step shown in FIG. 2B.
Figure 3B:
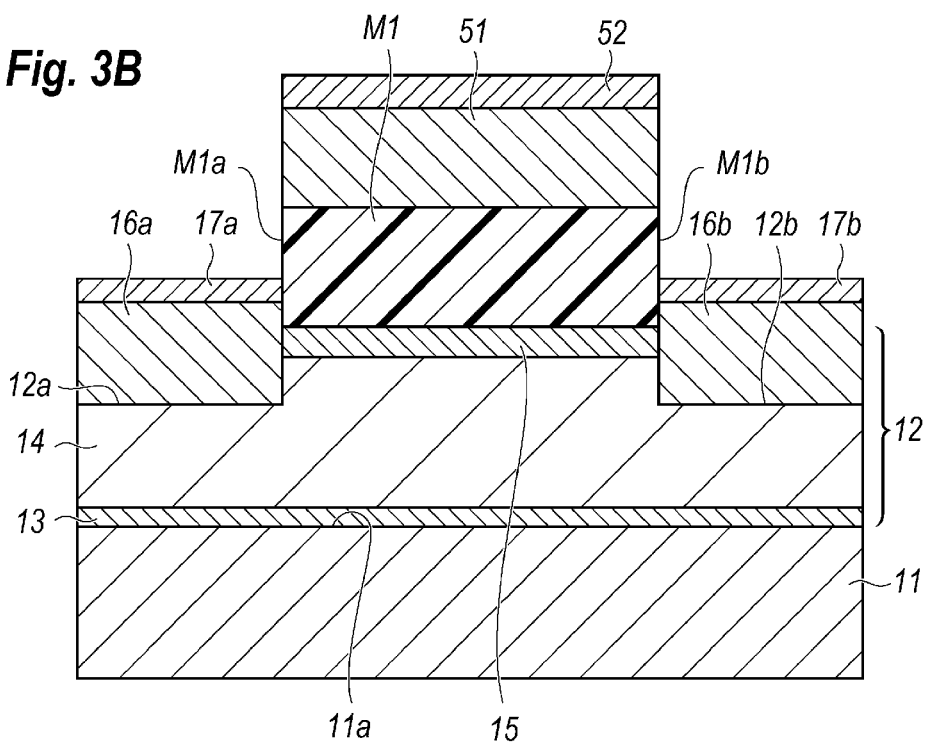

Thereafter, as shown in FIG. 3B, the process grows an oxide layer such as zinc oxide (ZnO) and so on, which becomes the n$^+$-regions, 16$a$ and 16$b$, within in the recesses, 12$a$ and 12$b$, and on the photoresist M1. A pulsed laser deposition (PLD) technique and/or an atomic layer deposition (ALD) technique may be used for growing the oxide semiconductor layer. The PLD and the ALD techniques enable a low temperature growth, for instance, at a temperature around 100° C. In the PLD, irradiating a target made of oxide semiconductor material, such as ZnO, with pulsed laser beams in oxygen (O$_2$) atmosphere, which vaporizes the oxide semiconductor material, the vaporized materials may be accumulated onto the substrate 11 as the oxide semiconductor material, then an oxide metal, such as AlO, ZrO and so on, is vaporized by the pulsed laser beam and the vaporized oxide semiconductor materials may be accumulated onto the former oxide semiconductor material, which forms the protecting layers, 17$a$ and 17$b$. During the former vaporization of the oxide semiconductor material, which is ZnO in the present embodiment, at least one of aluminum (Al) and gallium (Ga) is also vaporized as n-type impurities by density higher than 1×10$^{19}$ cm$^{-3}$.

Figure 4A:
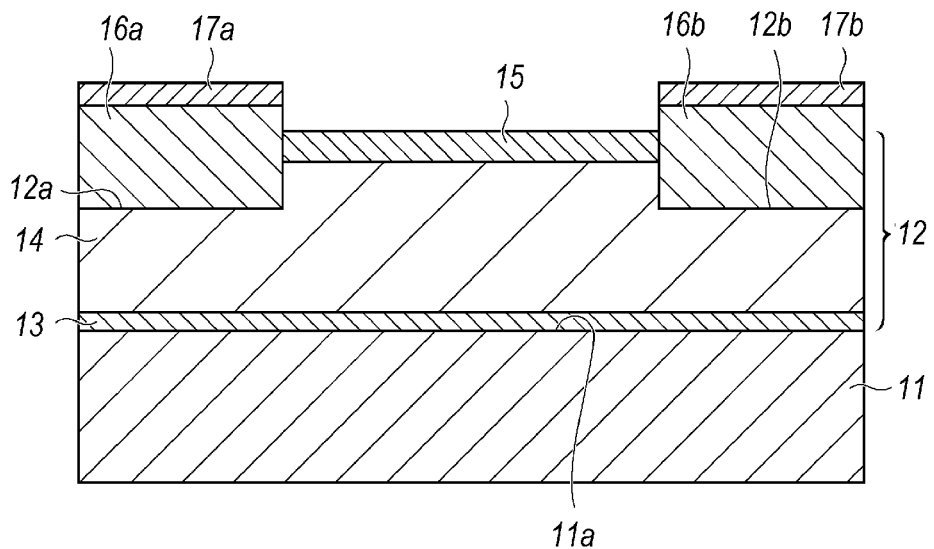
FIG. 4A and FIG. 4B are cross sectional views of the HEMT at respective steps of the process subsequent to the step shown in FIG. 3B.

Because the photoresist M1 is left on the semiconductor stack 12 during the PLD, or the ALD, residual oxide semiconductor materials 51 and oxide metal 52 are also deposited on the photoresist M1. Removing the photoresist M1 concurrently with the residual oxide materials, 51 and 52, by the process of, what is called, the lift-off, the n$^+$-regions, 16$a$ and 16$b$, formed by the oxide semiconductor material and the protecting layers, 17$a$ and 17$b$, made of other oxide material may be left on the semiconductor stack 12 so as to sandwich the barrier layer 15 without any gaps therebetween, as shown in FIG. 4A. Because the PLD, or the ALD, process is a type of low temperature process with an rectilinear trace for vaporized materials, not only the photoresist M1 is left unchanged and suppressed for vaporized materials to be adhered to sides of the openings, M1$a$ and M1$b$, which enables the lift-off process for removing the residual materials, 51 and 52, left on the photoresist M1. Also, the process of the embodiment continuously and sequentially deposits the oxide semiconductor material, namely ZnO and the oxide material, namely at least one of AlO and ZrO, which may protect the surfaces of the oxide semiconductor material in the n$^+$-regions, 16$a$ and 16$b$.

Figure 4B:
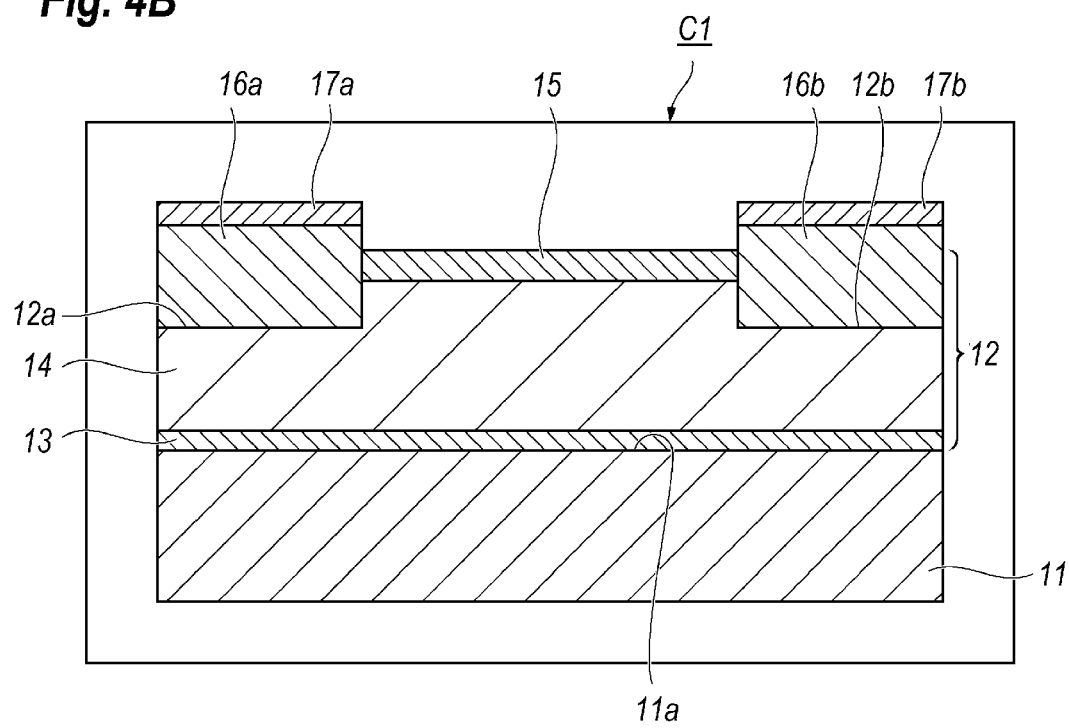

Thereafter, the process rinses a surface of the protecting layers, 17$a$ and 17$b$, by an acidic solution; then, carries out a heat treatment for the n$^+$-regions, 16$a$ and 16$b$, and the protecting layers, 17$a$ and 17$b$, by loading the substrate within a furnace C1, as shown in FIG. 4B. The heat treatment may be carried out at a temperature of 400 to 800° C. in an atmosphere of oxygen (O$_2$), nitrogen (N$_2$), or a mixture thereof. The heat treatment may recover crystal quality of the n$^+$-regions, 16$a$ and 16$b$, and the protecting layers, 17$a$ and 17$b$.

Figure 5A:
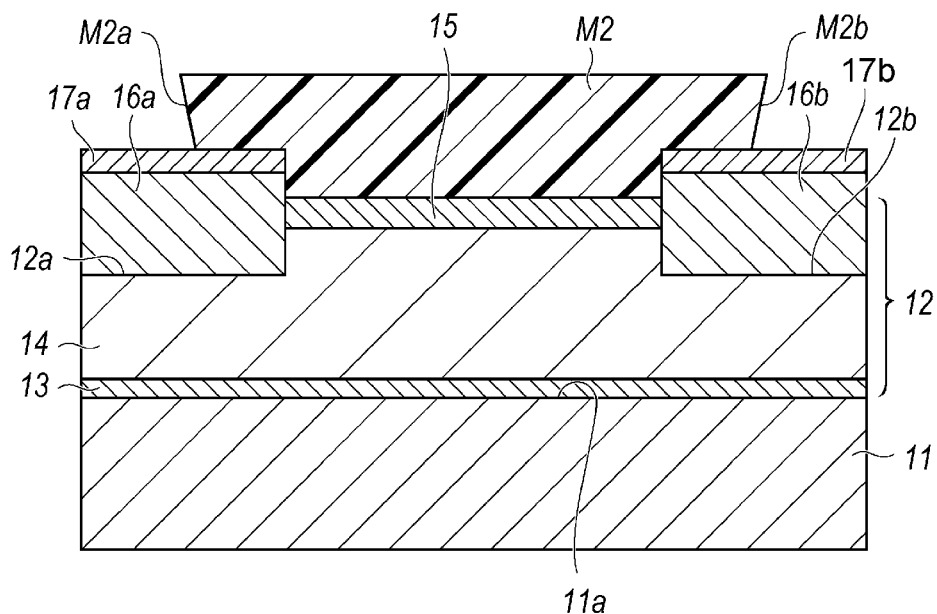
FIG. 5A and FIG. 5B are cross sectional views of the HEMT at respective steps of the process subsequent to the step shown in FIG. 4B.
Figure 5B:
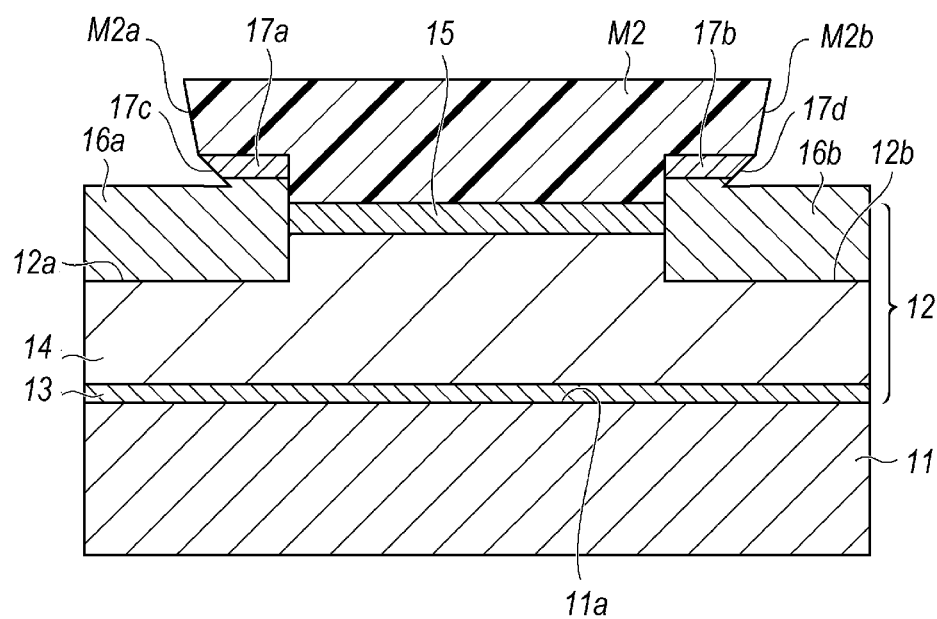

Thereafter, as shown in FIG. 5A, another patterned photoresist M2 covers the protecting layers, 17$a$ and 17$b$, and the barrier layer 15 exposed between the protecting layers, 17$a$ and 17$b$, where the photoresist M2 has openings, M2$a$ and M2$b$, within which surfaces of the protecting layers, 17$a$ and 17$b$, are exposed. Then, the protecting layers, 17$a$ and 17$b$, are etched using the photoresist M2 as an etching mask to expose the n$^+$-regions, 16$a$ and 16$b$, within the openings, 17$c$ and 17$d$, of the protecting layers, 17$a$ and 17$b$. The etching of the present step may be carried out by the RIE process using carbon tetrafluoride (CF$_4$) as a reactive gas. The RIE process may slightly etch the n$^+$-regions, 16$a$ and 16$b$, to form recesses therein.

The openings, M2$a$ and M2$b$, in the patterned photoresist M2 shows overhangs; specifically, edges of the openings, M2$a$ and M2$b$, gradually retreat as being closer to the n$^+$-regions, 16$a$ and 16$b$. Similarly, the opening, 17$c$ and 17$d$, in the protecting layers, 17$a$ and 17$b$, also provide overhangs. Those overhangs in the openings, M2$a$ and M2$b$, in the patterned photoresist M2 and those, 17$c$ and 17$d$, in the protecting layers, 17$a$ and 17$b$, may accelerate the lift-off process subsequently carried out for leaving metals on the n$^+$-regions, 16$a$ and 16$b$.

Figure 6A:
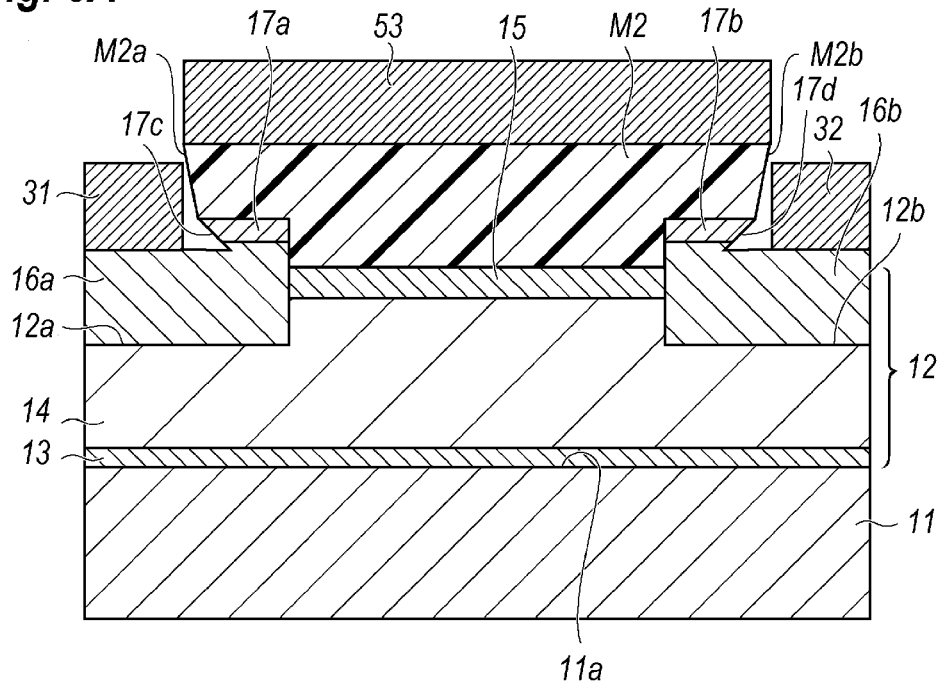
FIG. 6A and FIG. 6B are cross sectional views of the HEMT at respective steps of the process subsequent to the step shown in FIG. 5B.

Thereafter, as shown in FIG. 6A, the process deposits metals for the electrodes of the source 31 and the drain 32 not only onto the n$^+$-regions, 16$a$ and 16$b$, within the openings, M2$a$ and M2$b$, but also onto the patterned photoresist M2, which is denoted as an element 53 in FIG. 6A. The metals 53 on the patterned photoresist M2 may be removed concurrently with a removal of the patterned photoresist M2 by organic solvent, which is often called as the lift-off process. Alloying the metals left within the openings, 17$c$ and 17$d$, in the protecting layers, 17$a$ and 17$b$, at a temperature higher than 500° C., the electrodes of the source 31 and the drain 32 may be formed.

Figure 6B:
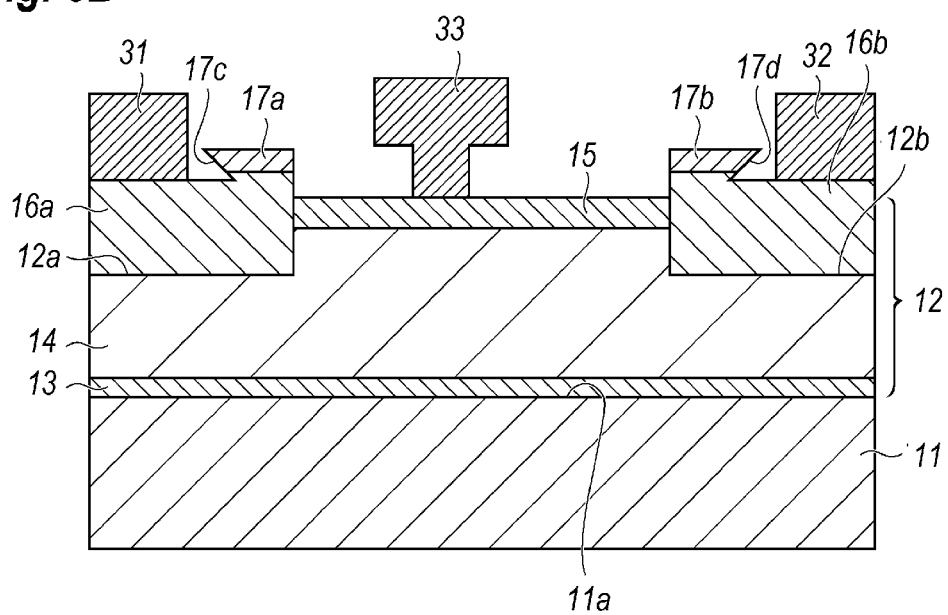

Thereafter, as shown in FIG. 6B, the process forms the gate electrode 33 so as to be in direct contact with the barrier layer 15. Specifically, fully covering the electrodes of the source 31 and the drain 32, the barrier layer 15 and the protecting layers, 17$a$ and 17$b$, between the electrodes, 31 and 32, with an insulating film, which is not illustrated in figures, then forming an opening corresponding to the gate electrode 33 in the insulating film; stacked metals are deposited so as to be in direct contact with the barrier layer 15 filling the opening in the insulating film and partly extend on the insulating film around the opening. Thus, the gate electrode 33 with a T-shaped cross section may be formed on the barrier layer 15. The T-shaped cross section may narrow the gate length thereof without degrading gate resistance because of a widened upper portion thereof.

Finally, a passivation film 41 made of insulating material such as silicon nitride (SiN), fully covers the substrate 11 including the electrodes of the source 31, the drain 32, and the gate 33, and the barrier layer 15 and the protecting layers, 17a and 17b, exposed between the electrodes. Thus, the HEMT 1A according to the process of the present embodiment may be completed.

Advantages of the HEMT 1A and the process of forming the HEMT 1A will be described. As described, when the $n^+$-regions, 16a and 16b, are formed by selective growth of nitride semiconductor materials; the $n^+$-regions are limited in carrier concentrations thereof because a mono-silane ($SiH_4$), which is used as a source material for n-type dopants, in the dissociation thereof is restricted. An $n^+$-region requires conditions of: (1) a high electron concentration without degrading mobility thereof; (2) substantially no barrier for the electron transportation is induced at an interface against the channel layer 14, which means that an $n^+$-region in a materials thereof has physical properties closer to those of the channel layer; and (3) an electron affinity thereof is comparable to that of the channel layer 14, which causes no discontinuity $\Delta$Ec between the conduction bands.

Oxide semiconductor materials, such as ZnO and others involved within the ZnO group with the n-type conduction, are found to be an ideal material to satisfy the conditions (1)~(3) above described. Doping a ZnO with, for instance, aluminum (Al), gallium (Ga) and so on, such a ZnO may show an electron concentration around $1 \times 10^{19}$ $cm^{-3}$ or higher, which is far greater than that realized in n-type GaN. A ZnO has a lattice constant of 3.25 angstrom (0.325 nm) that is very close to that of GaN, specifically, 3.19 angstrom (0.319 nm), which means that a ZnO layer with an enough crystal quality may be grown on the GaN channel layer 14. Also, a ZnO has an electron affinity of 4.1 eV that is very close or substantially equal to that of GaN, specifically, 4.2 eV, which means that no band discontinuity appears in the interface therebetween.

Thus, a HEMT providing the $n^+$-regions made of n-type oxide semiconductor material, typically, an n-type ZnO like the $n^+$-regions, 16a and 16b, of the present embodiment may realize the access resistance and the contact resistance far smaller than those attributed to nitride semiconductor materials. The HEMT 1A of the embodiment may drastically enhance the trans-conductance gm and the cut-off frequency ft.

However, such oxide semiconductor materials generally show lesser tolerance against acid and/or alkali, that is, those oxide semiconductor materials generally show far faster etching rate for acid and/or alkali; the $n^+$-regions, 16a and 16b, are easily etched and degraded when the regions, 16a and 16b, are exposed to those acid and alkali during the process of forming the HEMT 1A, which results in wide scattering in the access resistance and the contact resistance.

Figure 7A:
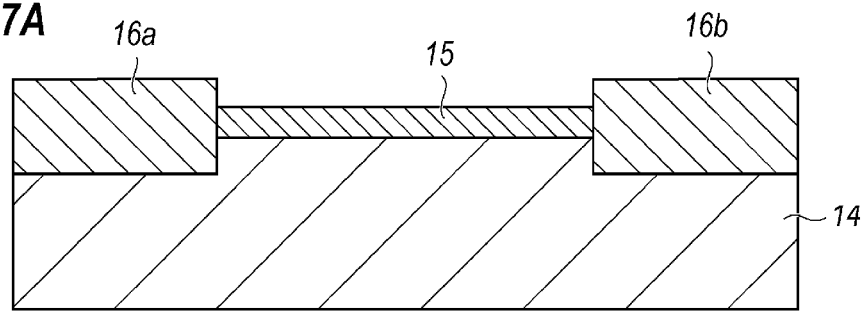
FIG. 7A to FIG. 7C explains conventional process of forming a HEMT at respective steps by cross sectional views thereof.
Figure 7B:
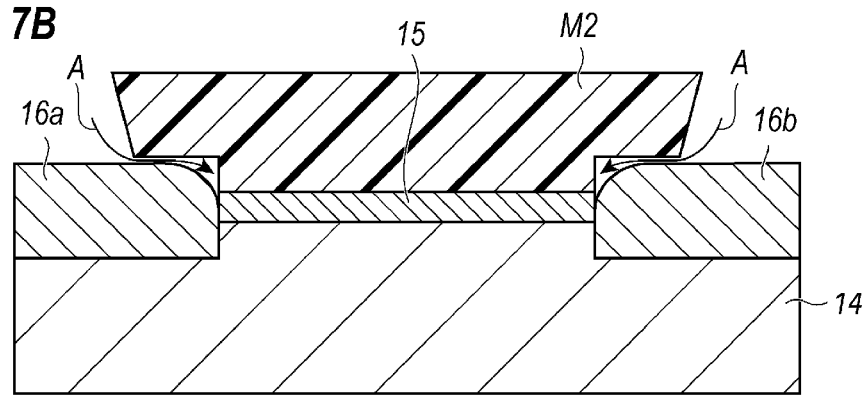
Figure 7C:
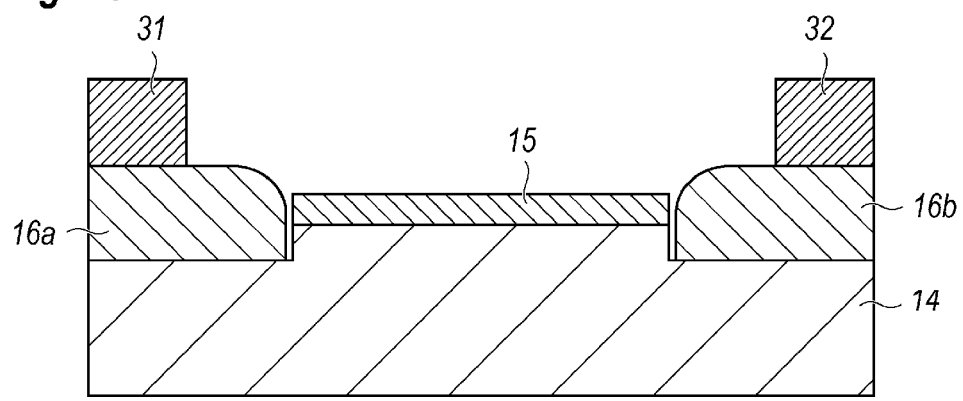

FIG. 7A to FIG. 7C explain the subject left in oxide semiconductor materials when the material is applied in the $n^+$-regions. As shown in FIG. 7A, a conventional process first forms recesses by partially etching the barrier layer 15 and the channel layer 14; then selectively grows the oxide semiconductor regions, 16a and 16b, as the $n^+$-regions in a HEMT. The process prepares the patterned photoresist M2 having the openings, M2a and M2b, rinses the oxide semiconductor regions, 16a and 16b, by an acidic solution, as shown in FIG. 7B, thereafter, forms the electrodes of the source 31 and the drain 32 on the deposited $n^+$-regions, 16a and 16b, as shown in FIG. 7C. However, as shown in FIG. 7B, an acidic solution for rinsing the grown oxide semiconductor layers, 16a and 16b, may etch the oxide semiconductor materials, 16a and 16b, and invade into a gap between the patterned photoresist M2 and the oxide semiconductor materials, 16a and 16b, as denoted by an arrow A in FIG. 7B. Such an acidic solution invading deeper within the gap is hard to be removed by immersing the substrate 11 within water, but further etches inner portions of the oxide semiconductor materials, 16a to 16b, to round corners thereof and form gaps against edges of the barrier layer 14 and the channel layer 13 as shown in FIG. 7C. Widths of the gaps are uncontrollable in the process, and scatters in respective HEMTs 1A.

Other oxide materials such as AlO and/or ZrO may show relatively enhanced tolerance against acid and/or alkali. Covering the $n^+$-regions, 16a and 16b, with those oxide materials, subjects left in the $n^+$-regions made of ZnO may be effectively solved. That is, the protecting layers, 17a and 17b, made of AlO and/or ZrO may effectively cover the $n^+$-regions, 16a and 16b, and prevent the acidic solution from invading between the photoresist M2 and the $n^+$-regions, 16a and 16b, and forming the gaps against the barrier layer 14 and the channel layer 13. Thus, the access resistance and the contact resistance of the $n^+$-regions may effectively suppress dispersion thereof. An AlO and/or ZrO are also an oxide material, which may show an excellent affinity against ZnO but has preferable tolerance against acid and/or alkali.

The $n^+$-regions, 16a and 16b, may have a thickness at least 120 nm, while, the protecting layers, 17a and 17b, may have a thickness at least 100 nm, which effectively protects the $n^+$-regions, 16a and 16b, from acid and/or alkali. The embodiment above described concentrates on the $n^+$-regions, 16a and 16b, made of ZnO; however, another oxide semiconductor material of ZnMgO may be applicable to the $n^+$-regions, 16a and 16b, in order to suppress deviation in the lattice constant when those regions, 16a and 16b, are highly doped with gallium (Ga) and/or aluminum (Al).

Also, the embodiment described above deposits the metals fort the electrodes, 31 and 32, as leaving the patterned photoresist M2 on the barrier layer 15. That is, the openings, 17c and 17d, are formed by etching the protecting layers, 17a and 17b, using the patterned photoresist M2 as the etching mask. The metals are deposited onto the $n^+$-regions, 16a and 16b, exposed within the openings, 17c and 17d, in the protecting layers, 17a and 17b, as leaving the patterned photoresist M2. However, in an alternative, the process may remove the patterned photoresist M2 after forming the openings, 17c and 17d, in the protecting layers, 17a and 17b, and prepare another photoresist for depositing the metals. Using the another photoresist that provides openings in positions over the $n^+$-regions, 16a and 16b, the metals may be deposited thereon and removed after the deposition accompanying with residual metals deposited on the another photoresist by the lift-off process. Thus, the electrodes of the source 31 and the drain 32 may be formed on the $n^+$-regions, 16a and 16b.

Next, some exemplary examples will be described comparing with conventional examples. A first comparable example of a HEMT provides the electrodes of the source 31 and the drain 32 directly on the barrier layer 15 without interposing $n^+$-regions, 16a and 16b; while a second example comparable example of a HEMT provides the n$^+$-regions, 16a and 16b, but omitting the protecting layers, 17a and 17b.

The example of the invention first sequentially grows a buffer layer 13 made of aluminum nitride (AlN) with a thickness of 30 nm by the MOCVD technique using TMA and NH$_3$ as source materials for aluminum (Al) and nitrogen (N), respectively, on the substrate 11 made of silicon carbide (SiC) at a growth temperature of 1080° C. and a growth pressure of 13.3 kPa; the GaN channel layer using a TMG and NH$_3$ as source materials for gallium (Ga) and nitrogen (N) at a growth temperature and a growth pressure of 1080° C. and 13.3 kPa, respectively; and the InAlN barrier layer, or the AlGaN barrier layer, with a thickness of 8 nm using a TMA, a TMI, and NH$_3$ for source materials of Al, In, and N at a growth temperature and a growth pressure of 800° C. and 15.0 kPa. The InAlN barrier layer has an indium (In) composition of 17%, which makes the InAlN barrier layer 15 lattice-matched with the GaN channel layer 14, where the layers from the buffer layer 13 to the barrier layer 15 may constitute the semiconductor stack 12.

Preparing the photoresist M1 on the barrier layer 15, where the photoresist M1 provides openings, M1a and M1b, in areas to which the n$^+$-regions, 16a and 16b, are to be selectively grown, the process forms recesses, 12a and 12b, with a depth of 800 nm in the semiconductor stack 12. Rinsing the surface of the semiconductor stack 12 including the recesses, 12a and 12b, the oxide semiconductor layer made of ZnO are selectively grown within the recesses, 12a and 12b, to form the n$^+$-regions, 16a and 16b, as leaving the photoresist M1. The oxide semiconductor layers are highly doped and have a thickness of 120 nm, which is greater than the depth of the recesses, 12a and 12b. Thus, tops of the n$^+$-regions, 16a and 16b, in respective levels thereof are higher than the top of the barrier layer 15. The selectively growth of the oxide semiconductor layer 16 may be grown by irradiating a ZnO target with laser beams in an oxygen atmosphere at 100° C. During the selective growth of the n$^+$-regions, 16a and 16b, aluminum (Al) is doped therein. Subsequent to the selective growth of the n$^+$-regions, 16a and 16b, the protecting layers, 17a and 17b, made of Al$_2$O$_3$ with a thickness of 100 nm are also deposited on the n$^+$-regions, 16a and 16b, using the PLD technique under conditions substantially same with those for selectively growing the n$^+$-regions, 16a and 16b. After rinsing the protecting layers, 17a and 17b, with an acidic solution, the n$^+$-regions, 16a and 16b, and the protecting layers, 17a and 17b, are heat treated at 600° C. for 30 minutes after removing the photoresist M1.

Thereafter, the process forms the openings, 17c and 17d, in the protecting layers, 17a and 17b, using the photoresist M2 that provides openings, M2a and M2b, in positions where the electrodes of the source 31 and the drain 32 are to be formed. Specifically, depositing metals within the openings, M2a and M2b, so as to be in contact with the n$^+$-regions, 16a and 16b, removing residual metals accumulated on the photoresist M2 by solving the photoresist M2, the deposited metals may be left on the n$^+$-regions, 16a and 16b. Alloying the metals, the electrodes of the source 31 and the drain 32 may be formed on the n$^+$-regions, 16a and 16b. The n$^+$-regions, 16a and 16b, are wider by about 1.0 μm than the electrodes of the source 31 and the drain 32 in respective sides thereof. That is, the electrodes of the source 31 and the drain 32 fully overlap with the n$^+$-regions, 16a and 16b. Forming the gate electrode including stacked metals of nickel (Ni) and gold (Au), where Ni is in direct contact with the barrier layer 15, and forming interconnections to the electrodes of the source 31, the drain 32, and the gate 33, the HEMT 1A for the comparison may be completed.

Table below compares the HEMT 1A of the embodiment with two conventional HEMTs without the n$^+$-regions and the protecting layers by (1) the contact resistance Rc (Ωmm) of the electrode against the n$^+$-region; (2) the access resistance Rn$^+$ (Ω/□) from the electrode to the boundary between the n$^+$-region and the channel 14a; (3) the access resistance Rsh (Ω/□) of the channel from the boundary against the n$^+$-region to the point beneath the gate electrode; and (4) the resistance Ron (Ωmm) from the source electrode to the drain electrode when the HEMT 1A turns on. Table also lists the cut-off frequency of the respective HEMTs.

|  | no n$^+$-region | n$^+$-ZnO (Theory) | n$^+$-ZnO (Experimental) | n$^+$-ZnO + Al$_2$O$_3$ film |
| --- | --- | --- | --- | --- |
| Rc (Ωmm) | 0.6 | 0.1 | 0.1 | 0.1 |
| Rn$^+$(Ω/□) | 300 | 100 | 100 | 100 |
| Rsh(Ω/□) | 300 | 300 | 300 | 300 |
| Ron(Ωmm) | 1.8 | 0.6 | 1.5 | 0.6 |
| ft (GHz) | 50 | 150 | 70 | 150 |

Referring to Table above, a conventional HEMT without n$^+$-regions, 16a and 16b, shows relatively low access resistance (Rsh) because of the existence of InAlN barrier layer; but shows enough large contact resistance Rc because the electrodes of the source 31 and the drain 32 are in direct contact with the barrier layer 15 without interposing the n$^+$-regions therebetween, which also results in large turn-on resistance Ron of 1.8 Ωmm and lesser cut-off frequency of 50 GHz.

Another HEMT with the n$^+$-regions, 16a and 16b, theoretically shows the contact resistance Rc and the access resistance Rn$^+$ smaller than those of the former HEMT without the n$^+$-regions, 16a and 16b, which results in low turn-on resistance of 0.6 Ωmm and a higher cut-off frequency of 150 GHz. However, such a HEMT with the n$^+$-regions, 16a and 16b, practically shows the turn-on resistance of 1.5 Ωmm, which is greater than twice of a theoretical value, and a degraded cut-off frequency ft of 70 GHz, where those performances seem to reflect instability in the process conditions thereof.

Figure 8:
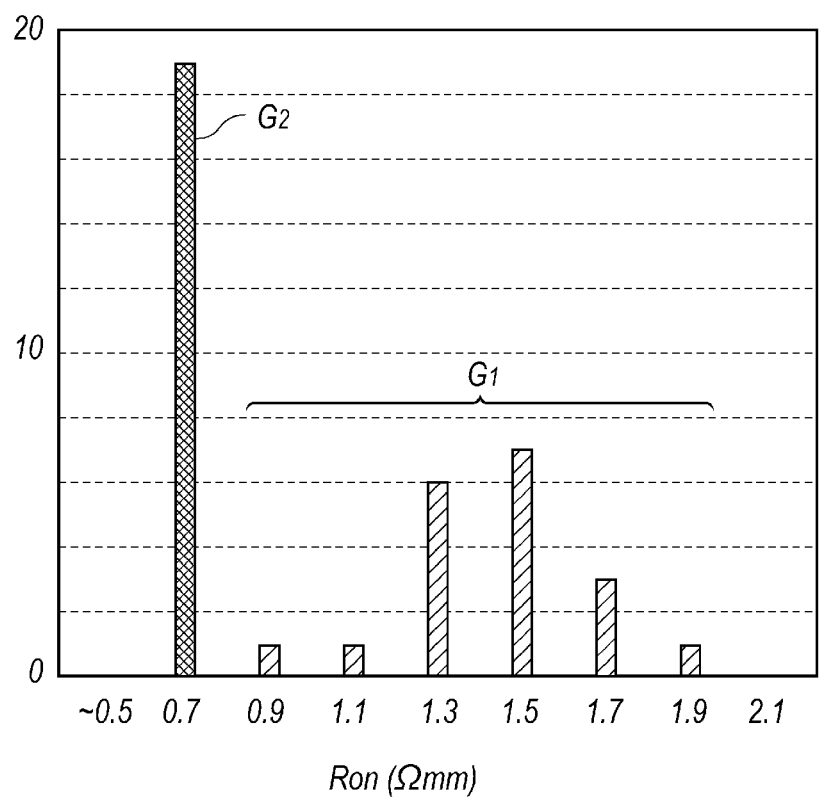

On the other hand, the HEMT according to the present invention shows the turn-on resistance Ron of 0.6 Ωmm and the cut-off frequency ft of 150 GHz, which becomes comparable to those theoretically estimated values. FIG. 8 compares scattering behaviors of the turn-on resistance Ron of the HEMT 1A of the present invention with a HEMT without the protecting layers, 17a and 17b, where a behavior G2 corresponds to the HEMT 1A of the invention, while, another behavior G1 corresponds to conventional HEMTs.

In the foregoing detailed description, the process and apparatus of the present invention have been described with reference to specific embodiment thereof. It will, however, be evident that various modifications and changes may be made thereto without departing from the broader spirit and scope of the present invention. For instance, the specification above concentrates of a semiconductor device type of HEMT, the present invention may be applicable to other types of a semiconductor device. Moreover, the HEMT described above may further provide a cap layer made of GaN with a thickness of a few nano-meters on the barrier layer 15. Accordingly, the present specification and figures are to be regarded as illustrative rather than restrictive.

What is claimed is:

1. A field effect transistor type (FET) of a high electron mobility transistor (HEMT) primarily made of nitride semiconductor materials, the FET comprising:
   a substrate;
   a semiconductor stack including nitride semiconductor layers;
   a pair of recesses provided in a surface of the semiconductor stack;
   a pair of $n^+$-regions provided within the respective recesses, the $n^+$-regions being made of oxide semiconductor materials doped with n-type dopants by a density higher than $1\times10^{19}$ cm$^{-3}$;
   a pair of protecting layers each made of oxide material, the protecting layers having respective openings and covering peripheries of the $n^+$-regions; and
   a pair of electrodes provided within the openings in the protecting layers, the electrodes being in direct contact with the $n^+$-regions.

2. The FET according to claim 1,
   wherein the $n^+$-regions are made of one of zinc oxide (ZnO) and magnesium zinc oxide (MgZnO).

3. The FET according to claim 2,
   wherein the recesses have a depth at least 80 nm, and the $n^+$-regions have a thickness at least 120 nm.

4. The FET according to claim 1,
   wherein the protecting layers have a thickness at least 100 nm.

5. The FET according to claim 1,
   wherein the electrodes are fully overlapped with the $n^+$-regions.

6. The FET according to claim 5,
   wherein the electrodes retreat from the $n^+$-regions by at least 1 μm.

7. The FET according to claim 1,
   wherein the nitride semiconductor layers include, from a side of the substrate, a buffer layer made of aluminum nitride (AlN), a channel layer made of gallium nitride (GaN), and a barrier layer made of one of aluminum gallium nitride (AlGaN) and indium aluminum nitride (InAlN), and
   wherein the $n^+$-regions are in direct contact with the barrier layer and the channel layer without forming a gap therebetween.

* * * * *